United States Patent [19]

Jason

[11] Patent Number: 5,204,563

[45] Date of Patent: Apr. 20, 1993

[54] MOSFET OUTPUT CIRCUIT WITH IMPROVED PROTECTION METHOD

[76] Inventor: Barry L. Jason, 325 Warbler Dr., Bedford, Tex. 76021

[21] Appl. No.: 823,884

[22] Filed: Jan. 22, 1992

[51] Int. Cl.$^5$ .................... H03K 17/687; H02H 7/122
[52] U.S. Cl. .................................. 307/585; 307/571; 307/584; 363/58
[58] Field of Search ................ 307/263, 571, 584; 363/56, 132, 136, 58

[56] References Cited

U.S. PATENT DOCUMENTS 4,594,650 6/1986 Kinbara .............................. 363/132
4,626,715 12/1986 Ishii .................................... 307/571

Primary Examiner—William L. Sikes
Assistant Examiner—Sinh Tran

[57] ABSTRACT

A MOSFET output driver circuit is protected from overstress caused by commutating currents. The MOSFETs are protected by employing a gate control circuit and a small inductor in series with the sources of the MOSFETs. The circuit limits the rate of change of current that reverse biases a MOSFET's drain-source diode. The circuit is applicable to totem-pole and bridge configurations.

8 Claims, 4 Drawing Sheets

MOSFET OUTPUT CIRCUIT WITH IMPROVED PROTECTION METHOD

BACKGROUND OF THE INVENTION

1. Field of the Invention

This invention relates to output driver circuits which employ MOS field effect transistors in a totem-pole or bridge connection for supplying power to a load device.

2. Description of the Prior Art

Totem-pole connections of MOSFET transistors have been used in output driver circuits to supply power to a load device. Each totem-pole circuit is formed by the series connection of a pair of MOSFETs. A bridge circuit can be formed by the combination of a pair of totem-pole drivers so that the load device can float between the outputs of the two totem-pole circuits and not require a direct connection to one of the supply terminals. These driver circuits find application in Pulse Width Modulation circuits where the desired low frequency signal is extracted from the PWM signal by a simple low pass filter network. These types of PWM circuits find application where high efficiency and low loss characteristics are desired for the driver circuit.

The simple totem-pole connection of MOSFET transistors unfortunately has catastrophic destructive modes for the MOSFETs. When supplying current to the low pass filter in a PWM circuit, or simply supplying current to an inductive load such as often encountered when these drivers are used for motor speed controllers, the commutating current flows through the alternate device's internal drain-source diode when the first MOSFET in the totem-pole pair turns off. When this first transistor returns to the on-state, the reapplied voltage, and high rate of change of current in the conducting drain-source diode form a set of destructive conditions.

The conventional solution to this problem is to provide an alternate path for the commutating current such that the current is prevented from flowing in the drain-source diodes of the MOSFETs. FIG. 2 shows the addition of 8 diodes to the bridge connection of MOSFETs where the diodes are configured such that commutating currents are prevented from flowing through the internal drain-source diodes of the MOSFETs. In FIG. 2 for example, if MOSFET devices 10 and 40 are initially conducting, forcing a current I (56) to flow through the low pass filter and the load as indicated, when devices 10 and 40 are turned off and forced into the non-conducting state, the presence of diodes 22 and 32 will prevent I (56) from flowing through the internal drain-source diodes of devices 20 and 30, and instead flow through diodes 24 and 34. This removes the set of destructive conditions from the MOSFETs and allows them to operate without overstress. An alternate connection for these diodes, and a more complete discussion of these protection circuits appears in the Motorola Data book *Power MOSFET Transistor Data*, Chapter 2-5, "Avalanche and dv/dt Limitations of the Power MOSFET," Q2/89, DL135, REV 3, to which the reader is referred for background and a detailed analysis.

There are several undesirable consequences of the use of external diodes to protect MOSFETs used in totem-pole and bridge circuits. The current handling capability of the external diodes has to be comparable to that of the MOSFET which is being protected. While diodes 12, 22, 32, and 42 can have very low breakdown voltage characteristic, diodes 14, 24, 34, and 44 must have comparable breakdown voltage characteristics to the MOSFETs being protected. These characteristics for the diodes result in component costs which add significantly to the total cost for the totem-pole or bridge circuit. Also, diodes with these characteristics are generally comparable in physical size to the MOSFETs, and therefore they consume an amount of printed circuit board that is comparable or larger in area than the area the MOSFETs themselves require. Finally, the voltage drop that occurs due to the diodes in series with the MOSFETs (12, 22, 32, and 42) leads to added dissipation in the totem-pole or bridge circuit and a corresponding reduction in efficiency. Removing the heat from these diodes can be difficult due to component and system packaging constraints.

SUMMARY OF THE INVENTION

It is, accordingly, an object of this invention to provide an output circuit using MOSFET devices connected in a totem-pole or bridge configuration that is protected from commutating current stress and that uses components that are easy to fabricate and therefore inexpensive.

It is a further object of this invention to provide an output circuit using MOSFET devices connected in a totem-pole or bridge configuration that is protected from commutating current stress and that uses protecting components that are small in physical size and therefore require minimal circuit board area.

It is yet a further object of this invention to provide an output circuit using MOSFET devices connected in totem-pole or bridge configuration that is protected from commutating current stress and that uses protecting components that do not dissipate power and therefore do not reduce the efficiency of the output circuit.

In accordance with the present invention, therefore, a output circuit is disclosed which is protected from commutating current stress and its protection circuit is composed of components which are small, have low loss, and are inexpensive. The output circuit is composed of a pair of MOSFET devices for the totem-pole configuration, and four MOSFETs for the bridge configuration, where small inductances are inserted in series with the sources of the MOSFETs and a controlled voltage is supplied to the gate of the MOSFET. By the addition of wave shaping components for the signal supplied to the gates of the MOSFETs, the value and size of the inductance required in the sources of the MOSFETs can be reduced.

BRIEF DESCRIPTION OF THE DRAWINGS

The present invention will be better understood when read in light of the accompanying drawings in which.

DESCRIPTION OF THE PREFERRED EMBODIMENT

Figure 3:
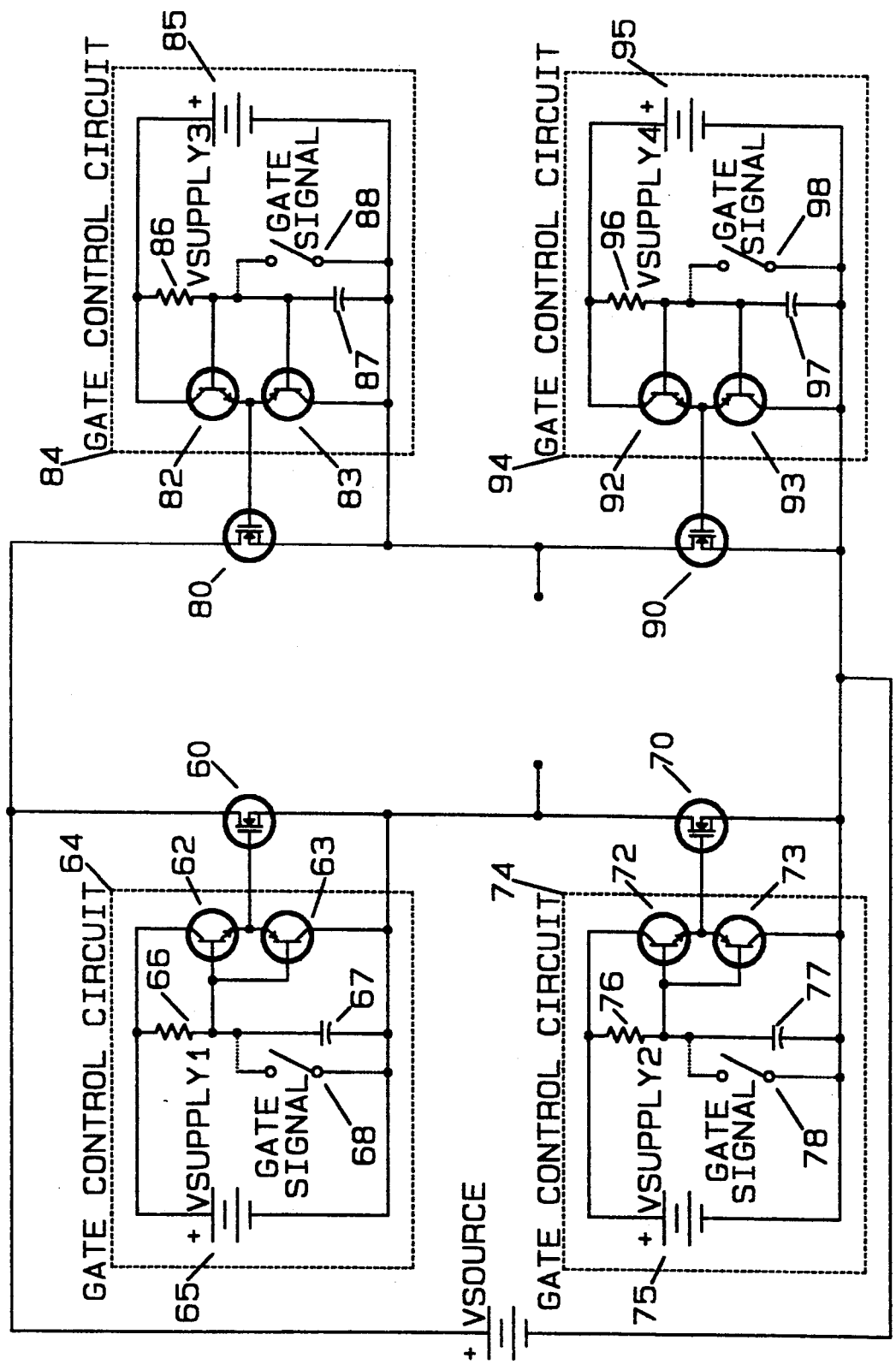
FIG. 3 is a circuit schematic of a bridge output circuit, similar to that of FIG. 1, but not incorporating the small inductance in series with the source of the MOSFETs.
Figure 4:
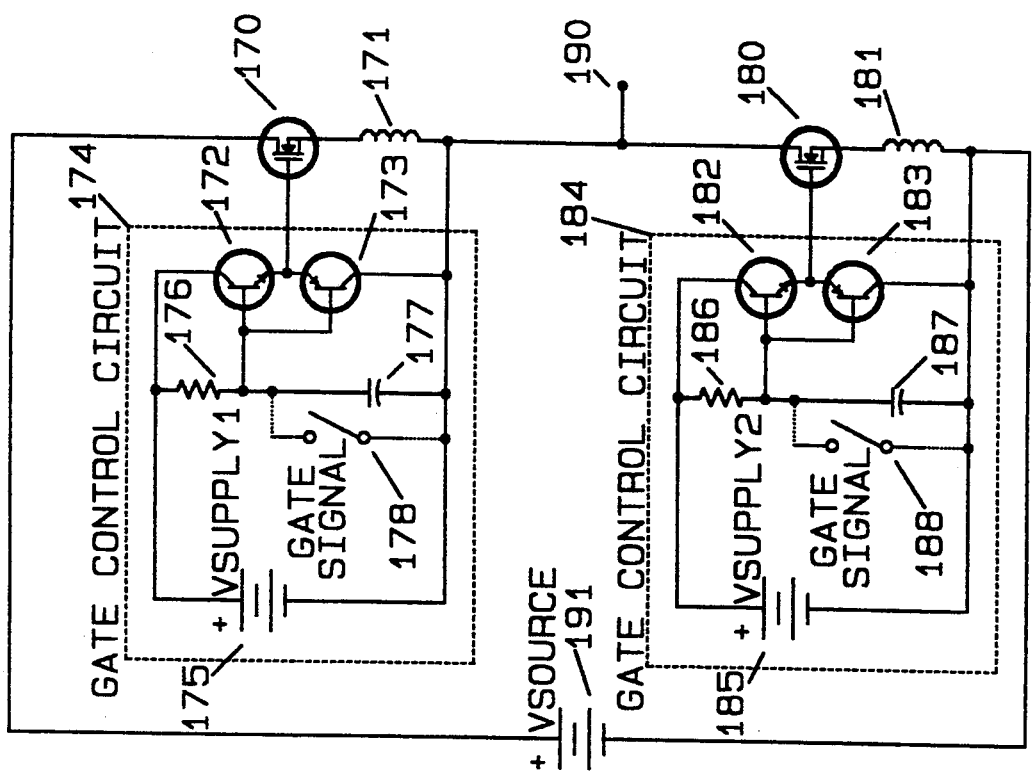
FIG. 4 is a circuit schematic of a totem-pole output circuit composed of a pair of MOSFETs, which incorporates the improved protection method of the present invention.

Turning first to the schematic representation of FIG. 3, the guaranteed safe operating area for a MOSFET, such as a 60, is specified by a parameter supplied by the manufacturer, and denoted CSOA (Commutating Safe Operating Area). This Commutating Safe Operating Area is specified only for rates of change of current less than some maximum value. As an example, for the Motorola MOSFET MTP5N40E, when the drain-source diode has undergone forward bias, the derivative of the current which then seeks to reverse bias the drain-source diode must be less that 90 amps per microsecond (di/dt<90A/uS). When the drain-source diode of the transistor 60 has undergone forward bias, the other device in the totem-pole pair, transistor 70, controls this parameter. Thus the rate of turn-on for transistor 70 must result in a current that rises no faster than 90A/uS.

One way to control the rate of change of current in the drain-source diode of 60 is to control the gate drive voltage of MOSFET 70. The current in MOSFET 70 (and thus the current in the drain-source diode of 60) is as follows:

$Id = Gfs * Vg$ (neglecting threshold voltage)
thus:
$di/dt = Gfs * dVg/dt$
where:
$Id$ is the drain current of the *MOSFET*
$Gfs$ is the forward transconductance of the *MOSFET*
$Vg$ is the gate voltage for the *MOSFET*

To limit di/dt to some value requires that Gfs * dVg/dt be less than that same value. In FIG. 3, NPN transistor 72, and PNP transistor 73 are buffers used to drive the gate impedance of the MOSFET. In this configuration they are used as voltage followers and have a voltage gain of substantially one. Thus when the Gate Signal 78, which substantially acts like a switch, permits the MOSFET 70 to turn on, the supply voltage 75, resistor 76, capacitor 77, and MOSFET 70 determine the rate of change of current (di/dt) for the drain-source diode of MOSFET 60.

Using the example given earlier for the Motorola MTP5N40E and the values given below for the circuit components:

Gfs=2 mho (minimum)

di/dt<90A/uS

R=R76=2200 ohms

C=C77=470 pf

VSUPPLY2=15 volts $Vg=(VSUPPLY2)*(1-exp(-t/RC))$ $Id=(VSUPPLY2)*(1-exp(-t/RC))*Gfs$ $di/dt=(VSUPPLY2)*(1/RC)*(exp(-t/RC))*Gfs$ The maximum value for di/dt will be found when t=0, so that:

$$di/dt \text{ (max)} = (VSUPPLY2) * (1/RC) * Gfs$$
$$= 30A/uS$$

Although this result is significantly lower than the specified maximum of 90A/uS, the circuit is not guaranteed of being in a safe operating area. This is because the parameter for Gfs was given to be its minimum value. Typical values for Gfs are more than a factor of 2 higher than the minimums, and maximum values for Gfs are not specified by device manufacturers, and are often significantly higher than the typical values. The fact that the maximum value of Gfs is an unbounded parameter for the MOSFET makes it difficult to guarantee that the device will remain in its guaranteed Commutating Safe Operating Area. Any attempt to overcompensate for a potentially high value of Gfs by reducing the gate supply voltage, or increasing the RC time constant will either increase the device's on-resistance or limit the maximum switching speeds for the circuit.

Figure 1:
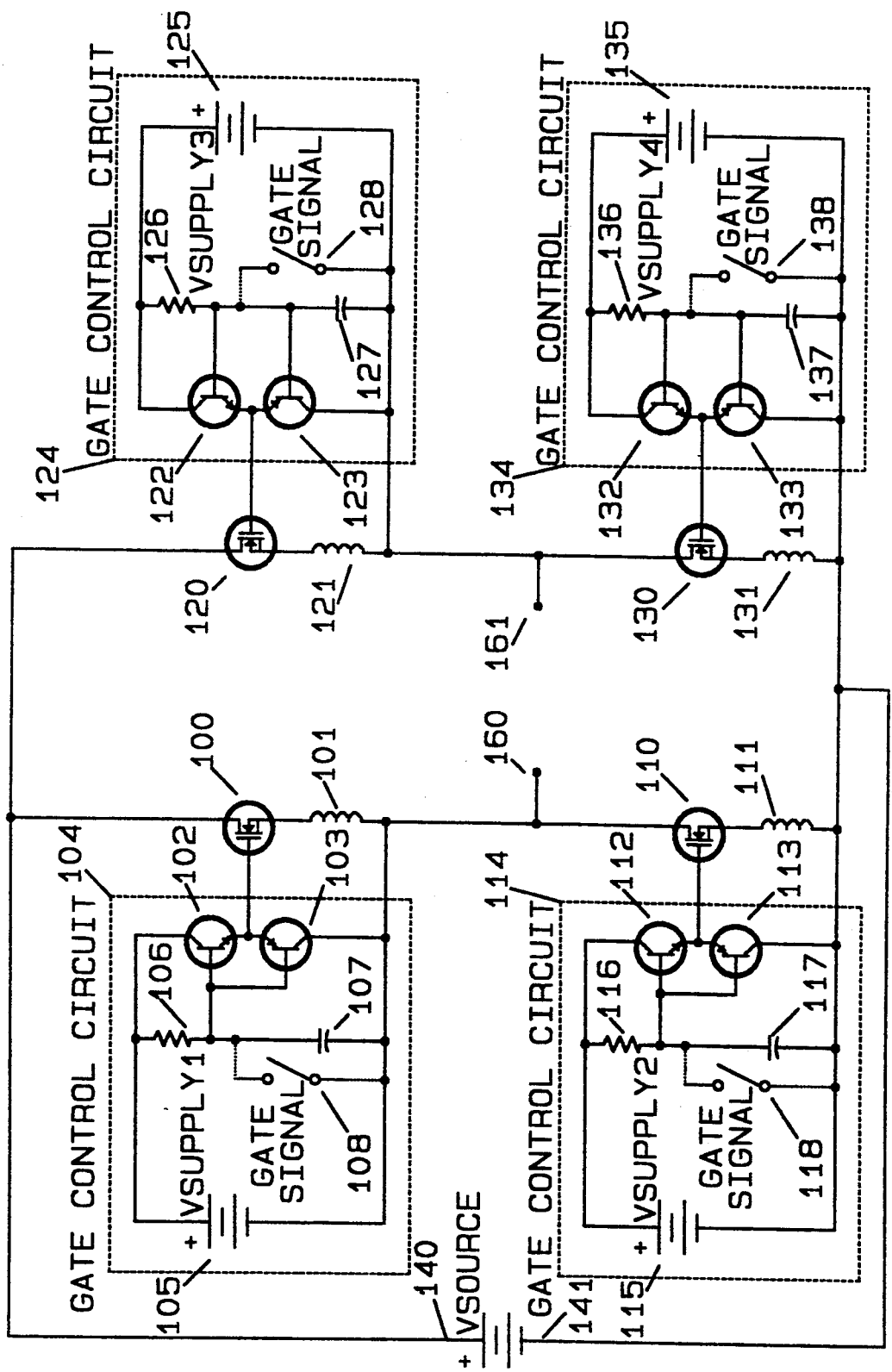
FIG. 1 is a circuit schematic of a bridge output circuit, composed of a pair of totem-pole MOSFET drivers, which incorporates the improved protection method of the present invention.
Figure 2:
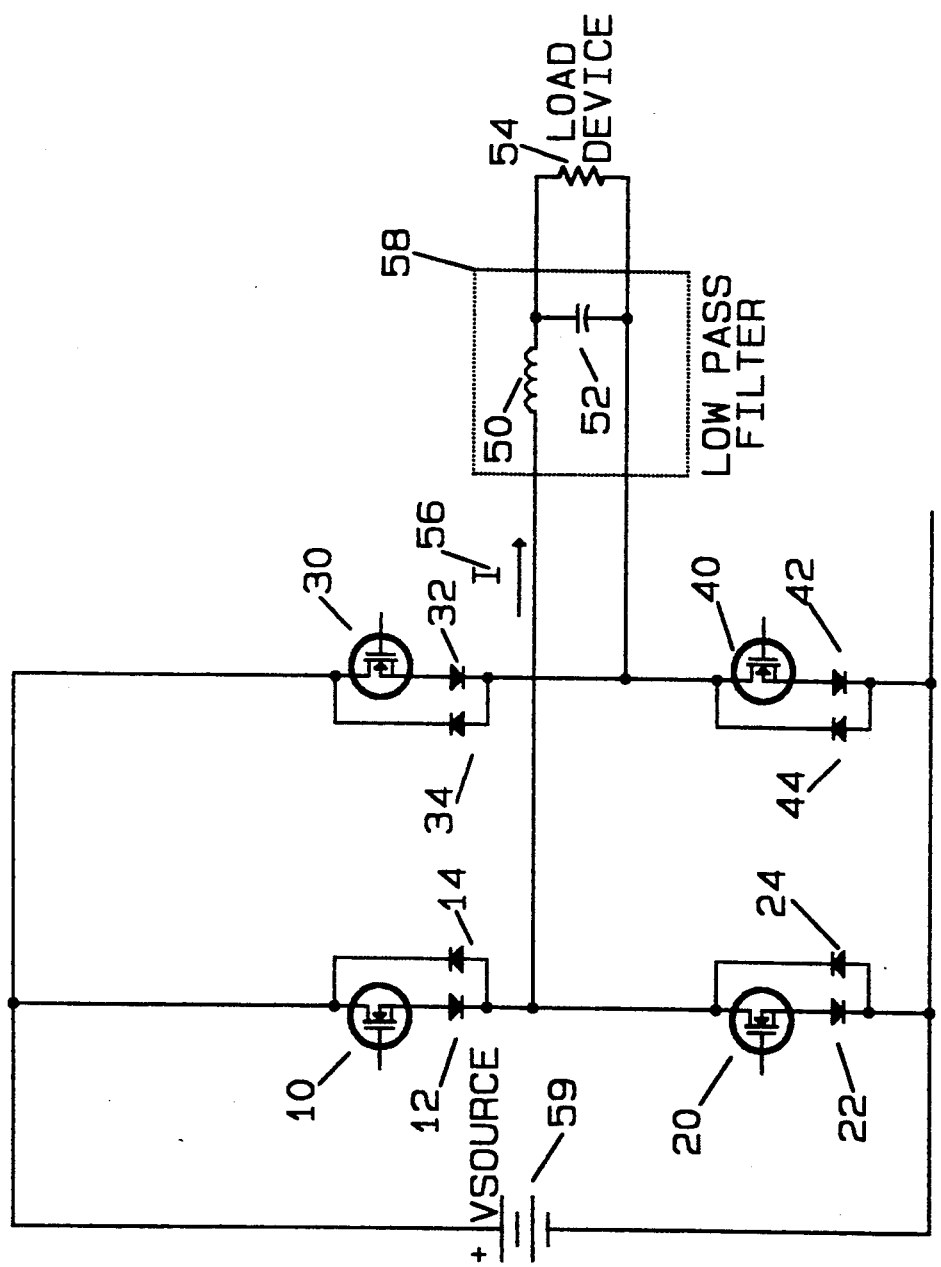
FIG. 2 is a circuit schematic of a bridge output driver using protection methods known in the prior art.

The solution to this problem is to insert a very small inductance, 101, 111, 121, and 131, in series with the source of the MOSFETs, as shown in the preferred embodiment in FIG. 1. With this combination of components, and even assuming an infinite value for Gfs, and an infinite rise time for the gate drive waveform, the maximum value for di/dt will remain bounded and specified:

$di/dt=(VSUPPLY2)/L111$ $L111>(VSUPPLY2)/(di/dt)$ $L111>(15)/(90A/uS)=166nH$

Inductors of this value are of the air core type and and can be easily formed by a low number of turns of copper wire. The inductor is physically small compared to alternative protection methods, and consumes little printed circuit board space. Because the inductor is constructed using readily available and inexpensive copper wire, it is a substantially less expensive component than other components that are used in prior art protection circuits. The inductor is constructed of low loss copper material, and as a result dissipates negligible power.

A combination of inductance in series with the source of the MOSFET, and components to limit the rise time of the gate voltage, can be used to reduce even further the value of the inductance required to limit di/dt. With a limited rise time waveform for the gate circuit and an inductor in series with the source of the MOSFET, the value for di/dt does not reach its maximum immediately. The value for di/dt will follow an exponential increase as approximated by the following:

$di/dt=(VSUPPLY2)*(1-exp(-t/RC))/L111$

Circuit simulations of the output driver shown in FIG. 1 show that for Gfs=8 mho, RC=1 uS, and L111=50 nH, the maximum value of di/dt does not exceed 64 A/uS.

FIG. 1 is a preferred embodiment of the MOSFET bridge output circuit with improved protection method. A pair of totem-pole drivers are connected in a bridge configuration, where devices 100 and 110 form the first totem-pole connected MOSFETs of the pair, and devices 120 and 130 form the second totem-pole connected MOSFETs of the pair. Terminal 140 is the positive terminal of the supply to the bridge circuit, and 141 is the negative terminal of the supply to the bridge circuit.

Each of the supplies 105, 115, 125, and 135 supply power to the gate control circuits 104, 114, 124, and 134, and driver transistor pairs 102/103, 112/113, 122/123, and 132/133, for each of their respective output MOSFET transistors, 100, 110, 120, and 130. The resistor-capacitor pairs 106/107, 116/117, 126/127, and 136/137 each control the rise time of the drive signal supplied to the respective driver transistor pairs 102/103, 112/113, 122/113, and 132/133. The driver transistor pairs in turn buffer the impedance of the resistor-capacitor pairs such that a low source impedance is presented to the gate terminal of the output MOSFETs 100, 110, 120, and 130. The inductance 101 is connected in series with the source of 100, such that in combination with the supply voltage 105, and the resistor-capacitor pair 106/107, the rate of change of current which reverse biases the drain-source diode in MOSFET 110 is restricted to a safe value. Similarly, inductor 111, supply 115, and resistor-capacitor pair 116/117 protect MOSFET 100; inductor 121, supply 125, and resistor-capacitor pair 126/127 protect MOSFET 130; and inductor 131, supply 135, and resistor-capacitor pair 136/137 protect MOSFET 120. The resulting driver circuit can supply power to a load through terminals 160 and 161.

While the present invention has been described in connection with the preferred embodiments of the various figures, it is to be understood that similar embodiments may be used and modifications and additions may be made to the described embodiments for performing the same functions of the present invention without deviating therefrom. Therefore, the scope of the invention is to be determined by reference to the claims which follow.

What is claimed is:

1. A MOSFET output circuit comprising a power source having a first and a second terminal, a first and a second MOSFET each having a drain terminal a source terminal and a gate terminal, a first and a second inductor each having a first and a second terminal, and a first and a second gate control circuit each having a first and a second terminal, in which:

the drain terminal of the first MOSFET is connected to the first terminal of the power source;
    the gate terminal of the first MOSFET is connected to the first terminal of the first gate control circuit;
    the source terminal of the first MOSFET is connected to the first terminal of the first inductor;
    the second terminal of this first inductor is connected to the drain terminal of the second MOSFET, the second terminal of the first gate control circuit, and an output terminal of said MOSFET output circuit;
    the gate terminal of the second MOSFET is connected to the first terminal of the second gate control circuit;
    the source terminal of the second MOSFET is connected to the first terminal of the second inductor;
    the second terminal of the second inductor is connected to the second terminal of the power source, and the second terminal of the second gate control circuit.

2. The MOSFET output circuit of claim 1 in which the gate control circuits include means for controlling a maximum voltage supplied to the gate terminal of the MOSFETs through each first terminal of the gate control circuit.

3. The MOSFET output circuit of claim 1 in which the gate control circuits include means for controlling the rise time of a waveform supplied to the gate terminal of the MOSFETs through each first terminal of the gate control circuit.

4. The MOSFET output circuit of claim 1 in which the gate control circuits include means for controlling a maximum voltage, and means for controlling the rise time of a waveform supplied to the gate terminal of the MOSFETs through each first terminal of the gate control circuit.

5. A MOSFET output circuit having a first and a second output terminals comprising a power source having a first and a second terminal, a first, second, third, and fourth MOSFET each having a drain terminal a source terminal and a gate terminal, a first, second, third, and fourth inductor each having a first and a second terminal, and a first, second, third, and fourth gate control circuit each having a first and a second terminal, in which:

the drain terminal of the first MOSFET is connected to the first terminal of the power source;
    the gate terminal of the first MOSFET is connected to the first terminal of the first gate control circuit;
    the source terminal of the first MOSFET is connected to the first terminal of the first inductor;
    the second terminal of this first inductor is connected to the drain terminal of the second MOSFET, the second terminal of the first gate control circuit, and the first output terminal of said MOSFET output circuit;
    the gate terminal of the second MOSFET is connected to the first terminal of the second gate control circuit;
    the source terminal of the second MOSFET is connected to the first terminal of the second inductor;
    the second terminal of the second inductor is connected to the second terminal of the power source, and the second terminal of the second gate control circuit;
    the drain terminal of the third MOSFET is connected to the first terminal of the power source;
    the gate terminal of the third MOSFET is connected to the first terminal of the third gate control circuit;
    the source terminal of the third MOSFET is connected to the first terminal of the third inductor;
    the second terminal of this third inductor is connected to the drain terminal of the fourth MOSFET, the second terminal of the third gate control circuit, and the second output terminal of said MOSFET output circuit;
    the gate terminal of the fourth MOSFET is connected to the first terminal of the fourth gate control circuit;
    the source terminal of the fourth MOSFET is connected to the first terminal of the fourth inductor;
    the second terminal of the fourth inductor is connected to the second terminal of the power source, and the second terminal of the fourth gate control circuit.

6. The MOSFET output circuit of claim 5 in which the gate control circuits include means for controlling a maximum voltage supplied to the gate terminal of the MOSFETs through each first terminal of the gate control circuit.

7. The MOSFET output circuit of claim 5 in which the gate control circuits include means for controlling the rise time of a waveform supplied to the gate terminal of the MOSFETs through each first terminal of the gate control circuit.

8. The MOSFET output circuit of claim 5 in which the gate control circuits include means for controlling a maximum voltage, and means for controlling the rise time of a waveform supplied to the gate terminal of the MOSFETs through each first terminal of the gate control circuit.

* * * * *